United States Patent
Goldbach et al.

(10) Patent No.: US 6,812,094 B2
(45) Date of Patent: Nov. 2, 2004

(54) METHOD FOR ROUGHENING A SURFACE OF A SEMICONDUCTOR SUBSTRATE

(75) Inventors: Matthias Goldbach, Dresden (DE); Annalisa Cappellani, Portland, OR (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/241,395

(22) Filed: Sep. 11, 2002

(65) Prior Publication Data

US 2003/0109101 A1 Jun. 12, 2003

(30) Foreign Application Priority Data

Sep. 11, 2001 (EP) ............................................. 01121847

(51) Int. Cl.[7] ......................................... H01L 21/8242
(52) U.S. Cl. ..................................... 438/255; 438/398
(58) Field of Search ............................... 438/260, 398, 438/255

(56) References Cited

U.S. PATENT DOCUMENTS

| | | | |
|---|---|---|---|
| 5,279,973 A | * | 1/1994 | Suizu .......................... 438/795 |
| 5,723,373 A | | 3/1998 | Chang et al. |
| 6,218,270 B1 | | 4/2001 | Yasunaga |
| 6,506,665 B1 | * | 1/2003 | Sato .......................... 438/458 |

FOREIGN PATENT DOCUMENTS

| | | |
|---|---|---|
| EP | 0 528 281 A2 | 2/1993 |
| EP | 0 828 287 A2 | 3/1998 |

* cited by examiner

*Primary Examiner*—Thanh Nguyen
(74) *Attorney, Agent, or Firm*—Laurence A. Greenberg; Werner H. Stemer; Gregory L. Mayback

(57) ABSTRACT

A method for roughening a surface of a semiconductor substrate includes the steps of placing the substrate in a furnace, introducing Oxygen and an inert gas, such as argon or nitrogen, into the furnace, maintaining the oxygen concentration in the furnace below 10%, and annealing the substrate at a temperature between 950° C. and 1200° C. to form mesopores in the surface of the semiconductor substrate.

11 Claims, 2 Drawing Sheets

METHOD FOR ROUGHENING A SURFACE OF A SEMICONDUCTOR SUBSTRATE

BACKGROUND OF THE INVENTION

Field of the Invention

The present invention relates to a method for roughening a surface of a semiconductor substrate.

In the technical field of semiconductor manufacturing, it is well known to produce dynamic random access memories (DRAMs) with memory cells including a selection transistor and a storage capacitor. Reducing the feature size drives the progress in semiconductor manufacturing. Accordingly, the number of functions disposed on a given area of a substrate can be increased.

As the surface area for a single memory cell decreases, the capacity of the storage capacitor is decreasing as well. For proper operation of the memory cell, a certain minimum capacity (typically in the order of 30 femto farad) is mandatory for the storage capacitor. If the capacity of the storage capacitor is too small, the charge stored in the storage capacitor is not sufficient to produce a detectable signal on the bit line when the selection transistor is opened. In such a case, the information stored in the memory cell is lost and the memory cell is not operating in the desired way.

Several ways exist in the prior art to overcome the problem of shrinking feature size. For example, a storage capacitor is formed in a deep trench to maintain a large capacitor area with a high capacity while using a small amount of the surface of the substrate. Another method to create a capacitor with a high capacity exists in a stacked capacitor disposed on the surface of the semiconductor substrate, above the selection transistor.

To increase the capacitor area, also existing in the prior art is the process of placing hemispherical grains on the electrodes of the capacitor. Hemispherical grains result in an increased capacitor area that increases the capacity. To form hemispherical grains, a polysilicon layer is deposited with a high roughness.

SUMMARY OF THE INVENTION

It is accordingly an object of the invention to provide a method for roughening a surface of a semiconductor substrate that overcomes the hereinafore-mentioned disadvantages of the heretofore-known devices of this general type and that roughens a surface of a semiconductor substrate to increase the capacitor area.

With the foregoing and other objects in view, there is provided, in accordance with the invention, a method for roughening a surface of a semiconductor substrate, including the steps of providing a semiconductor substrate having a surface, placing the semiconductor substrate in a furnace, introducing a process gas into the furnace, the process gas including oxygen and an inert gas selected from the group consisting of argon and nitrogen, maintaining an oxygen concentration in the furnace between approximately 0.1% and approximately 10%, and forming mesopores in the surface of the semiconductor substrate by annealing the substrate at a temperature between approximately 950° C. and approximately 1200° C.

The method according to the invention is applicable for example in DRAM technology for roughening the capacity area of a storage capacitor. The inventive process is intended to produce mesopores in the capacity area of the storage capacitor for enlarging the active area of the storage capacitor, resulting in an increased storage capacity. An advantage of the method for roughening the surface of a semiconductor substrate according to the invention is the elimination of additional etching gases such as chlorine or fluorine; as such gases are not necessary for the present invention. The forming of mesopores just uses process gases that are conventional for semiconductor manufacturing.

Advantageously, the invention increases the surface area and, hence, the capacity of the storage capacitor.

In accordance with another mode of the invention, the substrate is annealed at a temperature greater than 950° C., preferably, at least 1000° C. but less than 1200° C., the temperature at which the substrate may be damaged. The annealing provides enough energy to start and to pursue the reaction.

In accordance with a further mode of the invention, an oxygen concentration of between approximately 0.1% and approximately 1% is maintained in the furnace In accordance with an added mode of the invention, an oxygen concentration of between approximately 1% and approximately 10% is maintained in the furnace.

In accordance with an additional mode of the invention, the oxygen concentration in the furnace is less than 1%. Such a concentration enables the formation of silicon monoxide and suppresses the formation of silicon dioxide. The formation of silicon monoxide is remarkable at an oxygen concentration of higher than 0.1% of oxygen in the process gas.

In accordance with yet another mode of the invention, the annealing of the substrate is performed for a period of between 5 and 40 seconds. A preferred time period is about 30 seconds.

In accordance with yet a further mode of the invention, the substrate is etched in a solution containing water, ammonium hydroxide, and hydrogen peroxide ($H_2O$, $NH_4OH$, and $H_2O_2$) to smooth the mesopores. Such a process provides pores with improved regularity and avoids corners. It also widens the pores.

In accordance with yet an added mode of the invention, the substrate is etched several times in the above-mentioned solution to smooth the mesopores. The etching provides pores with improved regularity and avoids corners. It also widens the pores.

In accordance with yet an additional mode of the invention, the mesopores are formed having a diameter between 10 nm and 50 nm (nm=Nanometers). The given range for the diameter of the mesopores is suitable for enlarging the area of the capacitor in a way that improves the capacity of the storage capacitor.

In accordance with again another mode of the invention, the ratio between diameter and depth of the mesopores is between 0.25 and 4.

In accordance with again a further mode of the invention, the process parameters for oxidizing the silicon containing substrate are chosen such that the silicon containing substrate is oxidized to silicon monoxide, which is volatile and sublimates from the surface of the semiconductor substrate. As a result, the surface of the semiconductor substrate is roughened due to oxidation to silicon monoxide, which is, afterwards, sublimated due to the high temperature of between 950° C. and 1200° C.

With the objects of the invention in view, there is also provided a method for roughening a surface of a semiconductor substrate, including the steps of providing a semiconductor substrate having a surface, placing the semiconductor substrate in a furnace, introducing a process gas into the furnace, the process gas including oxygen and an inert gas, maintaining an oxygen concentration below approximately 10% in the furnace, and forming mesopores in the surface of the semiconductor substrate by annealing the substrate at a temperature between approximately 950° C. and approximately 1200° C.

With the objects of the invention in view, there is also provided a method for roughening a surface of a semiconductor substrate, including the steps of providing a semiconductor substrate having a surface, placing the semiconductor substrate in a furnace, introducing a process gas into the furnace, the process gas including oxygen and an inert gas selected from the group consisting of argon and nitrogen, maintaining an oxygen concentration below approximately 10% in the furnace, and forming mesopores in the surface of the semiconductor substrate by annealing the substrate at a temperature between approximately 950° C. and approximately 1200° C.

Other features that are considered as characteristic for the invention are set forth in the appended claims.

Although the invention is illustrated and described herein as embodied in a method for roughening a surface of a semiconductor substrate, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
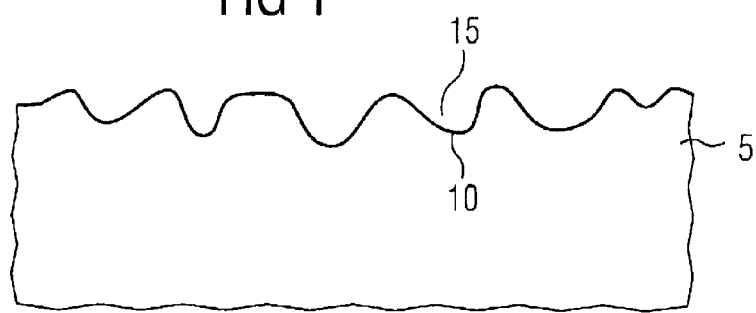
FIG. 1 is a fragmentary, cross-sectional view of a semiconductor substrate with a roughened surface having mesopores according to the invention.

Referring now to the figures of the drawings in detail and first, particularly to FIG. 1 thereof, there is shown a cross-section of a semiconductor substrate 5 having a surface 10. The surface 10 of the semiconductor substrate 5 has at least one mesopore 15. Typically, the surface 10 of the semiconductor substrate 5 has several mesopores 15 that increase the surface area of the semiconductor substrate 5. The semiconductor substrate 5, for example, contains silicon.

According to a method for roughening the surface 10 of the semiconductor substrate 5 to form the mesopores 15 in the surface 10 of the semiconductor substrate 5, the semiconductor substrate 5 is disposed in a process chamber such as a furnace. Oxygen and an inert gas such as argon or nitrogen are introduced into the process chamber. The oxygen concentration in the process chamber is kept below 10% and higher than 0.1%. The semiconductor substrate 5 is annealed to a temperature above 950° C., and above 1000° C. in a preferred embodiment. The preferred maximum annealing temperature is approximately 1200° C. to prevent substrate damage. The semiconductor substrate 5 is annealed in the furnace for a period of time between 5 and 40 seconds.

For the formation of the mesopores in a substrate 5 containing silicon, the silicon can be provided as monocrystalline, poly-crystalline, or amorphous. The silicon can also be doped to form n-type silicon or p-type silicon.

Advantageously, the method according to the invention is selective to silicon dioxide and silicon nitride that can mask the surface 10 of the semiconductor substrate 5 in areas where the surface 10 of the semiconductor substrate 5 should not be roughened by the method.

Advantageously, the mesopore formation mechanism is simple, cheap, and well controllable. The process can be used wherever a silicon area enhancement is required. The process is applicable to any capacitor with at least one electrode made of silicon.

For example, the capacitor could be a trench capacitor or a stacked capacitor of a DRAM cell.

In a preferred embodiment of the present invention, the oxygen concentration in the furnace is kept below 1%.

Figure 2:
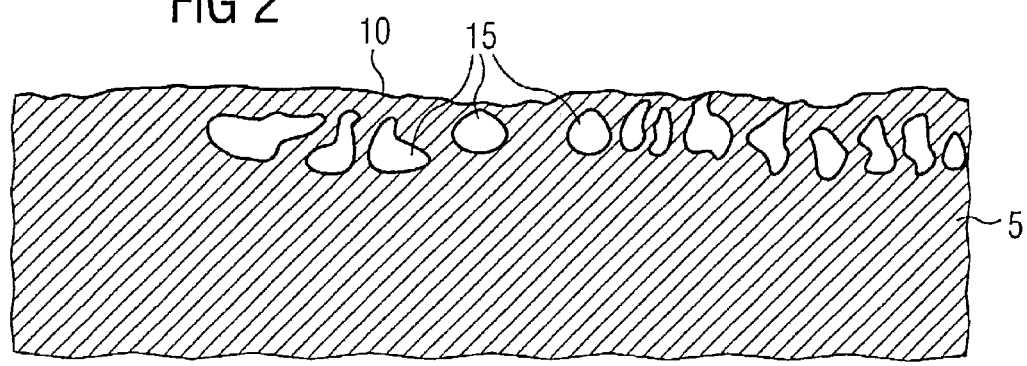
FIG. 2 is a fragmentary, cross-sectional view of a Scanning Electron Microscope picture of a cross-section through a substrate having mesopores according to the invention.

FIG. 2 shows a Scanning Electron Microscope (SEM) picture or a cross-section of a silicon substrate including mesopores 15 formed by the inventive method.

Figure 3A:
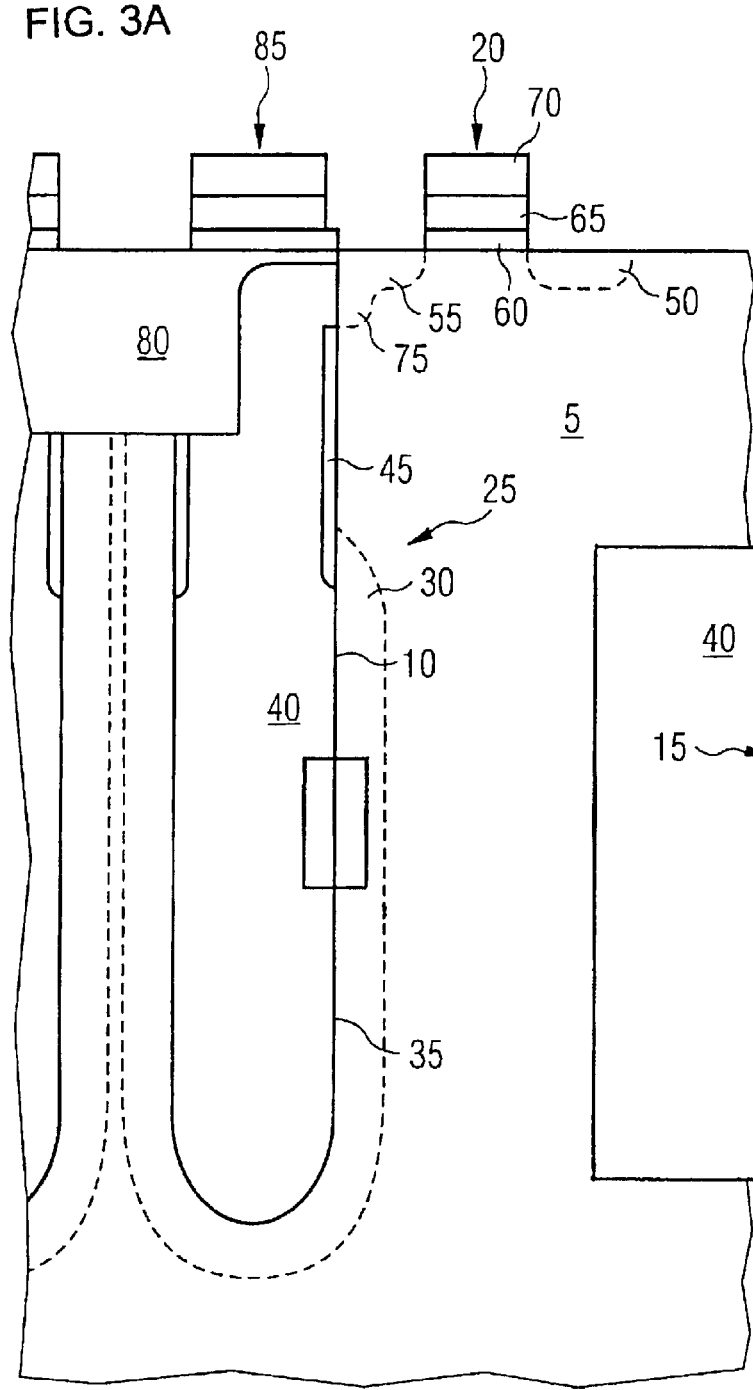
FIG. 3A is a fragmentary, cross-sectional view of a DRAM cell with a roughened surface according to the invention.

FIG. 3A shows a cross-section of a DRAM semiconductor memory cell having a trench capacitor and a planar selection field effect transistor 20. The selection field effect transistor 20 is disposed on the surface 10 of the substrate 5. A trench capacitor 25 is disposed in the substrate 5. The trench capacitor 25 has an outer trench capacitor electrode 30 disposed in the substrate 5 with a high doping concentration, an inner trench capacitor electrode 40 disposed in the trench capacitor 25, and a node dielectric 35, which separates the outer trench capacitor electrode 30 from the inner trench capacitor electrode 40. Additionally, a collar insulation 45 or collar isolation is disposed on the side wall of the trench capacitor 25 for insulation purposes.

The selection field effect transistor 20 has a source region 50 and a drain region 55, which are disposed in the semiconductor substrate 5. On top of the surface 10, the field effect transistor 20 includes a gate oxide 60, a first gate electrode 65, and a second gate electrode 70.

The selection transistor 20 is connected through its drain region 55 and a buried strap 75 with the inner trench capacitor electrode 40. On top of the trench capacitor 25 is disposed a shallow trench isolation (STI) 80 and, on top of the STI 80 is disposed a passing word line 85.

Figure 3B:
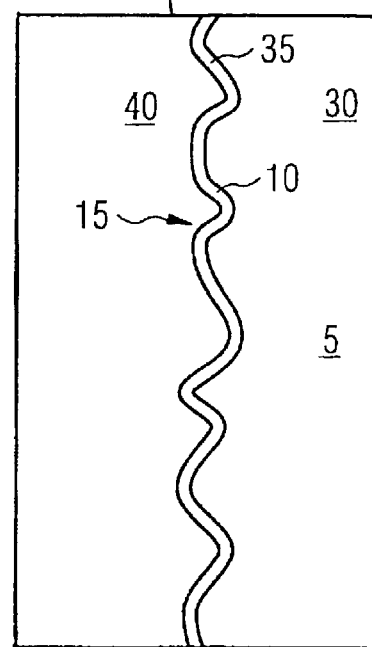
FIG. 3B is a cross-sectional view of an enlarged detail of FIG. 3A illustrating electrodes and a dielectric layer of a storage capacitor.

FIG. 3B shows a magnification of the surface 10 of the semiconductor substrate 5, which is disposed between the outer trench capacitor electrode 30 and the inner trench capacitor electrode 40. Mesopores 15 are disposed in the surface 10 of the semiconductor substrate 5. The node dielectric 35 is disposed on the surface 10.

A method for manufacturing the trench capacitor with a silicon electrode includes the steps of forming the trench for the trench capacitor and forming the collar insulation 45 in the upper part of the trench. The collar insulation 45 protects the collar region from being attacked by the roughening method for forming mesopores. The forming of the outer trench capacitor electrode 30 can be done before or after the forming of the mesopores 15 by introducing dopants into the semiconductor substrate 5. The substrate is annealed at higher temperatures than 950° C. in an inert ambient such as nitrogen with a controlled amount of oxygen of less then 10% in total gas flow.

The shape of the mesopores can be smoothened, for example, rounded, by a single wet etch step including $H_2O$, $NH_4OH$, and $H_2O_2$ (SC1). The smoothening of the mesopores does not add additional complexity to the process because it is needed as a preclean before the node dielectric 35 is formed on the surface 10.

We claim:

1. A method for fabricating a trench capacitor with an increased capacitance due to roughening a surface of a semiconductor within a trench, which comprises:

providing a semiconductor substrate having a surface;

placing the semiconductor substrate in a furnace;

introducing a process gas into the furnace, the process gas including oxygen and an inert gas selected from the group consisting of argon and nitrogen;

maintaining an oxygen concentration below approximately 10% in the furnace;

forming mesopores with a diameter between approximately 10 nm and approximately 50 nm in the surface of the semiconductor substrate by annealing the substrate at a temperature between approximately 950° C. and approximately 1200° C.;

smoothening the mesopores by etching the substrate in a solution containing water, ammonium hydroxide, and hydrogen peroxide;

disposing a dielectric layer on the semiconductor substrate;

disposing a first electrode on said dielectric layer; and forming a second electrode in said semiconductor substrate adjunct to said dielectric layer.

2. The method according to claim 1, which further comprises annealing the substrate at a temperature between approximately 950° C. and approximately 1000° C.

3. The method according to claim 1, which further comprises annealing the substrate at a temperature between approximately 1000° C. and approximately 1200° C.

4. The method according to claim 1, which further comprises maintaining an oxygen concentration of between higher than 0.1% and approximately 1% in the furnace.

5. The method according to claim 1, which further comprises carrying out the annealing for a period of time between approximately 5 seconds and approximately 40 seconds.

6. The method according to claim 1, which further comprises smoothening the mesopores by etching the substrate in a solution containing water, ammonium hydroxide, and hydrogen peroxide.

7. The method according to claim 1, which further comprises repeating the substrate-etching step.

8. The method according to claim 1, which further comprises forming a ratio between a diameter of the mesopores and a depth of the mesopores between approximately 0.25 and approximately 4.

9. The method according to claim 1, wherein the semiconductor substrate contains silicon, and which further comprises selecting substrate process parameters to oxidize the silicon-containing substrate to silicon monoxide sublimating from the surface of the silicon-containing substrate.

10. The method according to claim 1, wherein the semiconductor substrate contains silicon, and which further comprises selecting substrate oxidation process parameters to sublimate silicon monoxide from the surface of the silicon-containing substrate.

11. The method according to claim 1, wherein the semiconductor substrate contains silicon, and which further comprises oxidizing the silicon-containing substrate to sublimate silicon monoxide from the surface of the silicon-containing substrate.

* * * * *